United States Patent [19]

Miki

[11] Patent Number: 4,626,716

[45] Date of Patent: Dec. 2, 1986

[54] DIGITAL SIGNAL DELAY CIRCUIT

[75] Inventor: Yasuhiko Miki, Tokyo, Japan

[73] Assignee: Sony/Tektronix Corporation, Tokyo, Japan

[21] Appl. No.: 694,600

[22] Filed: Jan. 24, 1985

[30] Foreign Application Priority Data

Apr. 27, 1984 [JP] Japan ................... 59-85659

[51] Int. Cl.$^4$ ............ H03K 5/13; H03K 5/159
[52] U.S. Cl. .................. 307/590; 307/595; 307/602
[58] Field of Search ............... 307/590–605; 328/63

[56] References Cited

U.S. PATENT DOCUMENTS

| 3,443,070 | 5/1969 | Derby et al. | ............... 328/63 |
| 3,675,049 | 7/1972 | Haven | ............... 307/602 |
| 4,504,749 | 3/1985 | Yoshida | ............... 307/602 |

Primary Examiner—Stanley D. Miller
Assistant Examiner—B. P. Davis
Attorney, Agent, or Firm—Dellett, Smith-Hill and Bedell

[57] ABSTRACT

A digital signal delay circuit which delays a plurality of digital input signals by a use of a single delay device group and a plurality of delay sections is disclosed. The delay device group generates a plurality of different phase clock signals. Each of the delay sections includes selection means for selecting one of the clock signals from the delay device group and latch means for latching the digital input signal in response to the output signal from the selection means. The output signal from the latch means is the delayed input signal, and a delay time is controlled by the selection means. The delay device group is used in common for the plurality of delay sections, so that the digital signal delay circuit is simple and inexpensive in construction.

6 Claims, 3 Drawing Figures

DIGITAL SIGNAL DELAY CIRCUIT

BACKGROUND OF THE INVENTION

The present invention relates to a digital signal delay circuit which includes a plurality of delay sections each delaying a digital input signal independently for a desired time.

For example, digital signals from a digital pattern generator are applied to a digital circuit to be tested. In this instance, it is convenient to change phase of each bit of the parallel digital signals from the pattern generator independently, i.e., delay each bit of the digital signals independently for a desired time in accordance with characteristics of the digital circuit under test. Even if the digital signal is but a single digit, it may be used to produce a multiple-digit output signal by digit input by delaying the single signal for different times. For this purpose, a digital signal delay circuit having a plurality of digital sections is needed.

In a conventional digital signal delay circuit disclosed in U.S. Pat. No. 4,458,165, each of the delay sections includes variable delay means. This variable delay means comprises a plurality of delay devices (e.g. delay lines, lumped parameter delay lines, active devices, such as buffer amplifiers, logic gates, etc.) connected in series for delaying an input digital signal, and selection means for selecting one of the output signals from the delay devices for controlling the delay time.

Since the conventional circuit needs a plurality of delay devices and a selection means for each delay section, as the number of delay sections increases, the number of the delay devices increases also. Thus, the circuit becomes expensive and complex. It is necessary that the delay times of the delay devices in the delay sections are equal to each other for matching the delay characterictics of the delay sections. However, it is difficult to achieve a match in the delay characteristics of many delay devices.

SUMMARY OF THE INVENTION

According to the present invention, a digital signal delay circuit includes only one group of delay device(s) for delaying a plurality of input digital signals. The one group of the delay device(s) produces a plurality of output signals (including a non-delayed signal) by delaying a clock signal for different desired times, and is used in common for a plurality of delay sections. Each of the delay sections includes selection means for selecting one of output signals from the common delay device(s) and latch means for latching the input digital signal in responce to the output signal from the selection means. Since the selection means is provided in each of the delay sections, the delay time can be controlled every the delay section. The delay devices are common for all the delay sections, so that the delay characteristics of the delay sections are equal to each other and the delay circuit becomes compact and inexpensive. It should be noted that the maximum delay time of the clock signal is within one period of the input digital signal having the minimum period.

It is therefore one object of the present invention to provide an improved digital signal delay circuit for delaying a plurality of input digital signals independently for different times by a use of one group of delay devices.

It is another object of the present invention to provide an improved digital signal delay circuit including a plurality of delay sections having the same delay characteristics.

It is a further object of the present invention to provide an improved digital signal delay circuit which is compact and inexpensive in comparison with the prior art.

The present invention is pointed out with particularity in the appended claims. Other objects and advantages of the present invention will become apparent to those having ordinary skill in the art when taken in conjunction with the accompanying drawings.

DRAWINGS

DETAILED DESCRIPTION OF THE INVENTION

Figure 1:
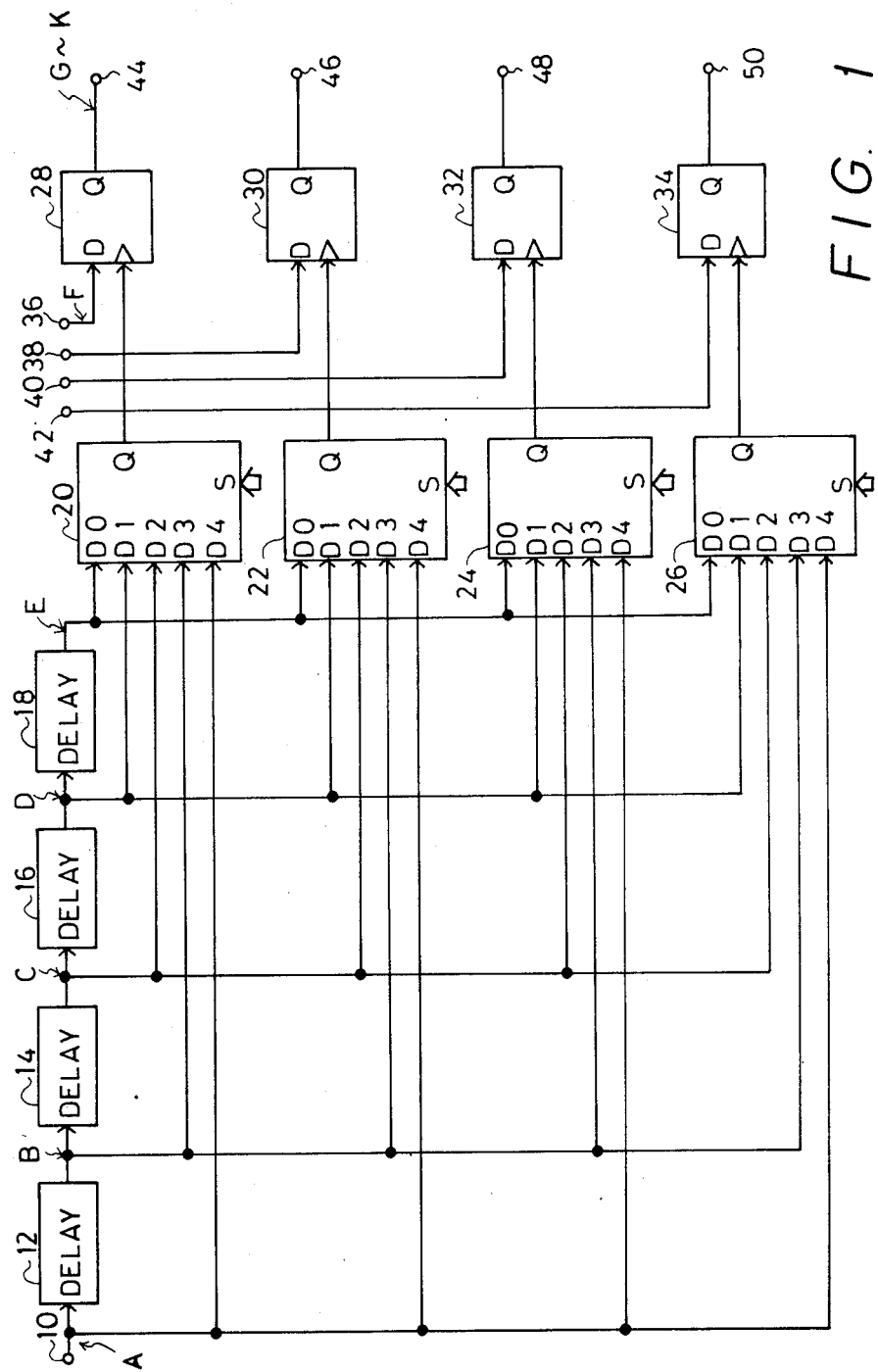
FIG. 1 is a block diagram of a first preferred embodiment according to the present invention.

Referring to FIG. 1, there is shown a block diagram of a first embodiment according to the present invention. A clock input terminal 10 is connected to a series circuit consisting of delay devices 12 through 18. These delay devices are, for example, delay lines, lumped parameter delay lines, a delay line having taps, or active devices, such as buffer amplifiers or logic gates. In the cause of a delay line having taps, each delay part acts as a delay device. The delay times of the delay devices may be equal to each other or may be different from each other. Each input terminal D4 through D0 of multiplexers 20 through 26 as selection means are respectively connected to the input terminal 10 and the output ends of the delay devices 12 through 18. In each of the multiplexers 20 through 26, the output terminal Q is connected to one of the input terminals D0 through D4 in response to a control signal applied to the control terminal S. D type flip-flops 28 through 34 as latch means have the D input terminals to respectively receive input digital signals from terminals 36 through 42 and the clock terminals to respectively receive the Q output signals from the multiplexers 20 through 26. It should be noted that a single digital input signal may be applied to the D input terminals of all the flip-flops 28 through 34. The Q output terminals of the flip-flops 28 through 34 are connected to output terminals 44 through 50, respectively. A combination of each of the multiplexers 20 through 26 and each of the flip-flops 28 through 34 constructs each of delay sections.

Figure 2:
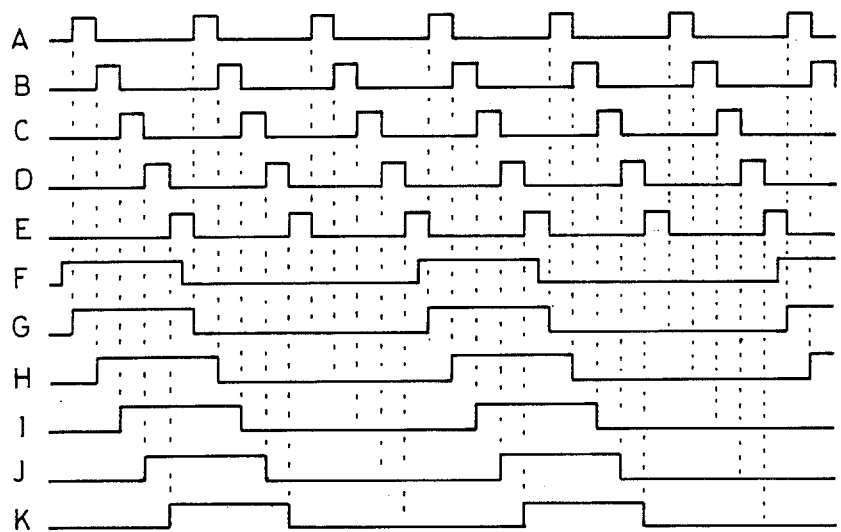
FIG. 2 is a time chart for explaining the operation of FIG. 1.

The operation of FIG. 1 will be described by reference to waveforms of FIG. 2. When a clock signal A is applied to the clock terminal 10 and is delayed by the delay devices 12 through 18, the delayed output signals therefrom are shown as waveforms B through E. In this embodiment, the delay time of each of the delay devices is the same.

Since the construction of each delay section is the same, only the delay sections 20-28 will be discussed. A digital input signal F is applied to the input terminal 36, wherein one period of the input signal F (clock period for generating the signal F) is longer than the delay time of the clock signal E delayed with respect to the clock signal A (total delay time of the delay devices 12 through 18). When the multiplexer 20 selects the clock signal A in accordance with the control signal, the flip-flop 28 will latch the digital input signal F in response to the rising edge of the clock signal A and the digital output signal at the terminal 44 will be a waveform G. When the multiplexer 20 selects the clock signal B, a digital signal H will be obtained at the terminal 44. The output signal H is delayed with respect to the output signal G for the delay time of the delay device 12. Similarly, when the multiplexer 20 selects the clock signal C, a digital output signal I will be obtained. The output signal I is delayed with respect to the output signal G for the total delay time of the delay devices 12 and 14. When the multiplexer 20 selects the clock signal D, a digital output signal J is delayed with respect to the output signal G for the total delay time of the delay devices 12 through 16. When the clock signal E is selected, a digital output signal K is delayed for the total delay time of the delay devices 12 through 18.

The delay sections 22–30, 24–32 and 26–34 will be operated as described hereinbefore. When the multiplexers 20 through 26 select the clock signal A, the delay times of the digital output signals are not zero with respect to the digital input signals if the input signals are not in phase with the clock signal A. However, this does not affect the relative relations of all the delay sections, because it affects all the delay sections. As discussed hereinbefore, the phase differences among the digital output signals at the terminals 44 through 50 can be adjusted by controlling the delay time of each the delay section independently.

Figure 3:
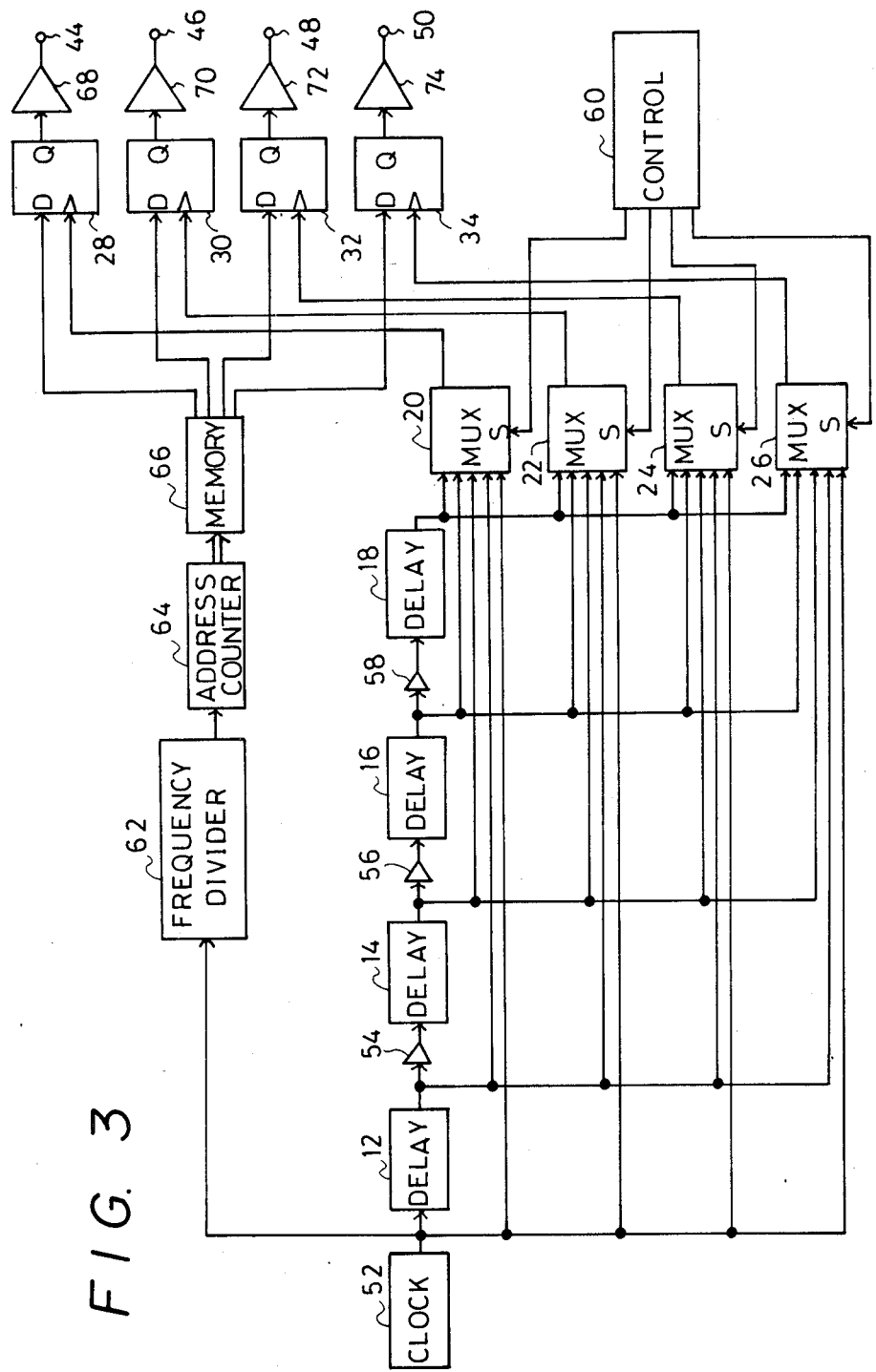
FIG. 3 is a block diagram of a digital pattern generater including a second preferred embodiment according to the present invention.

FIG. 3 shows a block diagram of a digital pattern generater employing a second embodiment of the present invention. The same devices as the devices of FIG. 1 are indicated by the same reference numbers in FIG. 1, and only differences will be discussed. A reference clock generater 52, such as a crystal oscillator generates a clock signal to be applied to the delay device 12 and the multiplexers 20 through 26. Buffer amplifiers 54 through 58 are provided between each of the delay devices for compensating the clock signal attenuated by the delay devices. The buffer amplifiers are not connected at the input sides of the multiplexers 20 through 26, because the multiplexers have buffer functions. A control circuit 60 applies the selection control signals to the multiplexers 20 through 26.

A variable frequency divider 62 divides the frequency of the clock signal from the clock generater 52 if necessary, and the output signal from the divider 62 is applied to an address counter 64. A memory 66 stores a four-bit parallel digital pattern, and the digital pattern is read sequentially therefrom in respose to the address signal from the address counter 64. Each bit of the read digital pattern is applied to the D input terminal of each of the flip-flops 28 through 34. Buffer amplifiers 68 through 74 are connected between the Q output terminals of the flip-flops 28 through 34 and the output terminals 44 through 50, respectively.

In the embodiment of FIG. 3, the output signals from the memory 66 are the digital input signals to the delay circuit. The digital input signal frequency can be changed by changing the dividing ratio of the frequency divider 62. Since the divided clock frequency is lower than the clock frequency of the clock generater 52, an error operation may not occur by the frequency change if the total delay time of the delay devices 12 through 18 is set to be shorter than the period of the digital input signal produced with the non-delayed clock signal. It should be noted that the digital input signals are synchronized with the clock signal. If the propagation delay times of the buffer amplifiers 54 through 58 cannot be neglected with respect to the delay devices 12 through 18, they must be considered. Thus, the digital pattern consisting of the bits having desired delay differences (phase differences) can be obtained from the output terminals 44 through 50.

As described hereinbefore, the present invention uses one group of delay devices in common for the plurality of delay sections, so that there is no delay time dispersion in the delay sections and the number of delay devices can be reduced. Thus, the characteristics of the delay circuit are stable, and the construction thereof becomes simple and inexpensive. The present invention is effective, when high precision of the delay time is requested or the number of delay sections is large.

While I have shown and described herein the preferred embodiments of the present invention, it will be apparent to those skilled in the art that many changes and modifications may be made without departing from the present invention in its broader aspect. For example, any number of the delay sections may be desired, and the selection means may be a combination of logic gates or a mechanical switch instead of the multiplexer. The latch means may be a J-K flip-flop. The buffer amplifiers inserted between the delay devices may be mere amplifiers or gate circuits. Compensation delay devices may be provied as the next stages of the latch means for compensating the propagation delay times of the selection means and the latch means. The output from a single selection means may control the plurality of latch means. The delay means may be parallel connected delay devices having different delay times. If a delay line is used as the delay device, the characteristic impedance thereof should be considered. If a plurality of the delay circuits of the present invention are connected in series, the digital input signal can be delayed for a time longer than one period thereof.

Only one delay device may be used and the selection means may select the non-delayed clock or the delayed clock.

I claim:
1. A digital delay circuit, comprising:
   first and second delay devices each having an input terminal and an output terminal, the input terminal of said second delay device being connected to the output terminal of said first delay device;
   first and second selection means each having first, second and third input terminals connected to the input and output terminals of said first delay device and the output terminal of said second delay device respectively and also having an output terminal, each selection means being operable to connect one of its input terminals to its output terminal; and
   first and second latch means having respective clock input terminals connected to the output terminals of the first and second selection means respectively and also having respective output terminals, and each latch means having a data input terminal for receiving a digital input signal that is to be latched in response to a signal received at the clock input terminal.

2. A digital delay circuit according to claim 1, wherein each of said selection means is a multiplexer.

3. A digital delay circuit according to claim 1, wherein each of said latch means is a flip-flop.

4. A digital delay circuit comprising:

a delay device having an input terminal and an output terminal;

first, second and third selection means each having first and second input terminals connected to the input and output terminals respectively of the delay device and also having an output terminal, each selection means being operable to connect one of its input terminals to its output terminal; and first, second and third latch means having respective clock input terminals connected to the output terminals of the first, second and third selection means respectively and also having respective output terminals, and each latch means having a data input terminal for receiving a digital input signal that is to be latched in response to a signal received at the clock input terminal.

5. A digital delay circuit according to claim 4, wherein each of said selection means is a multiplexer.

6. A digital delay circuit according to claim 4, wherein each of said latch means is a flip-flop.

* * * * *